(12) United States Patent
Kumar et al.

(10) Patent No.: US 11,804,832 B2
(45) Date of Patent: Oct. 31, 2023

(54) STARTUP PROTECTION FOR STANDBY AMPLIFIERS

(71) Applicant: Micron Technology, Inc., Boise, ID (US)

(72) Inventors: Mishal Kumar, Patna (IN); Wei Lu Chu, Pudong (CN)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 17/514,785

(22) Filed: Oct. 29, 2021

(65) Prior Publication Data

US 2023/0140202 A1  May 4, 2023

(51) Int. Cl.
| | | |
|---|---|---|
| G11C 5/00 | (2006.01) | |
| H03K 17/10 | (2006.01) | |
| H03K 17/687 | (2006.01) | |
| H03K 17/732 | (2006.01) | |
| G11C 5/14 | (2006.01) | |
| H03K 17/30 | (2006.01) | |

(52) U.S. Cl.
CPC ........... *H03K 17/102* (2013.01); *G11C 5/144* (2013.01); *G11C 5/148* (2013.01); *H03K 17/302* (2013.01); *H03K 17/6871* (2013.01); *H03K 17/732* (2013.01); *H03K 2217/0036* (2013.01)

(58) Field of Classification Search
CPC ......... G11C 5/147; G11C 5/148; G11C 5/141; G11C 5/144; G11C 29/12; G11C 29/12005; G11C 5/14; G11C 11/406; G11C 11/40615; G11C 11/4074; G11C 2211/4068; G11C 7/02; G11C 7/062; G11C 7/08; H03K 17/102; H03K 17/302; H03K 17/6871; H03K 17/732; H03K 2217/0036; H03K 19/00361; H02J 1/10; G06F 1/26
USPC ....................................................... 365/226
See application file for complete search history.

(56) References Cited

U.S. PATENT DOCUMENTS

2005/0140349 A1\* 6/2005 Ho ........................... G06F 1/26
                                                        323/299

\* cited by examiner

*Primary Examiner* — Thong Q Le
(74) *Attorney, Agent, or Firm* — Fletcher Yoder, P.C.

(57) ABSTRACT

Embodiments herein relate to protection of a standby amplifier of a memory device. Specifically, an input voltage of the standby amplifier may be reduced to decrease an occurrence of damage to the standby amplifier or components thereof. In some embodiments, the input voltage may be reduced using a voltage divider that provides the reduced input voltage to the standby amplifier during a power up operation. Upon completion of the power up operation, the input voltage of the standby amplifier may return to an operating voltage. The reduced input voltage may reduce the occurrence of damage to the standby amplifier by maintaining a gate to drain voltage of one or more transistors of the standby amplifier below a maximum.

20 Claims, 5 Drawing Sheets

STARTUP PROTECTION FOR STANDBY AMPLIFIERS

BACKGROUND

The present disclosure generally relates to computing systems and, more particularly, to reducing a startup voltage of a standby amplifier to reduce a breakdown of an input device of the standby amplifier.

Generally, a computing system includes a host sub-system and a memory sub-system. The memory sub-system may store data accessible to processing circuitry of the host sub-system. For example, to perform an operation, the processing circuitry may execute instructions retrieved from a memory device implemented in the memory sub-system. In some instances, input data for the operation may also be retrieved from the memory device. Additionally or alternatively, data output (e.g., resulting) from the operation may be stored in the memory device, for example, to enable subsequent retrieval. However, in some instances, operational efficiency of the computing system may be limited by the architecture of the memory sub-system and, in particular, to circuitry related to the column-select operation for retrieving data stored in the memory device.

BRIEF DESCRIPTION OF THE DRAWINGS

Various aspects of the present disclosure may be better understood upon reading the following detailed description and upon reference to the drawings described below.

DETAILED DESCRIPTION

The present disclosure provides apparatus and techniques that facilitate improved operating efficiency and/or operating performance of computing systems, for example, by reducing a voltage of an enable signal for a startup amplifier while minimizing an increase of a physical size of the computing system.

A computing system generally includes various computing sub-systems, such as a host (e.g., processing) sub-system and a memory sub-system. The host sub-system may include processing circuitry, for example, implemented in one or more processors and/or one or more processor cores. The memory sub-system may include one or more memory devices (e.g., chips or integrated circuits), for example, implemented on a memory module, such as a dual in-line memory module (DIMM), and/or organized to implement one or more memory arrays (e.g., banks of memory cells).

Generally, during operation of the computing system, processing circuitry implemented in the processing sub-system may perform various operations by executing instructions stored in the memory sub-system. For example, the processing sub-system may determine output data by executing a data processing operation based on input data. Additionally, a processing sub-system may generally include one or more registers and/or one or more processor-side caches, which provide storage locations directly accessible to the processing sub-system. However, storage capacity implemented in a processing sub-system is generally limited.

As such, the processing sub-system is often communicatively coupled to a memory sub-system via one or more memory buses (e.g., external communication, command, and/or data buses). In some cases, a computing system may include multiple memory buses, for example, each dedicated to different types of communication. For example, the computing system may include a memory command (e.g., control and/or request) bus dedicated to communication of command (e.g., control) signals indicative of memory access command (e.g., a memory read or write command), and a memory data bus dedicated to communication of data signals indicative of a data block to be stored (e.g., written) in a memory device of the memory sub-system (e.g., in response to a memory write command and/or a memory read command).

Moreover, in some instances, memory in a memory sub-system may be implemented using multiple different memory types. For example, the memory sub-system may include one or more volatile memory devices, such as a dynamic random-access memory (DRAM) device and/or a static random-access memory (SRAM) device, one or more non-volatile memory devices, such as a flash (e.g., NAND) memory device, a phase-change memory (e.g., 3D XPoint™) device, and/or a ferroelectric random access memory (FeRAM) device The memory device(s) in a memory sub-system generally includes various amplifiers (e.g., regulators), including a standby amplifier and an active amplifier. The active amplifier may be a main amplifier of the memory device and may support a relatively large amount of current, for example during a read or write operation. The standby amplifier may be operational when there is no current demand or minimal current demand from the memory device. The standby amplifier may ensure that voltages in the memory device are maintained at a specified level when there is no or minimal current demand. A maximum current provided by the standby amplifier may be about ten to twenty percent of a maximum current of the active amplifier. For example, if a maximum current of the active amplifier is about five milliamps (mA), the standby amplifier may provide up to about 500 microamps (µA). The standby amplifier may be powered on at startup (e.g., power up) and during operation of a respective memory device.

Protection of memory devices and associated amplifiers may be critical during startup because voltages of the memory device may be in a meta-stable state. To protect a startup amplifier of the memory device, an input voltage (e.g., enable voltage) of the startup amplifier may be reduced. Embodiments presented herein provide apparatus and techniques to reduce a startup voltage of a standby amplifier to improve an operating performance and prolong a life of one or more components thereof. Further, the reduced startup voltage may be clamped to the standby amplifier only during the startup operation and thus may not affect the standby amplifier or memory device during a normal operation mode (e.g., after startup).

Figure 1:
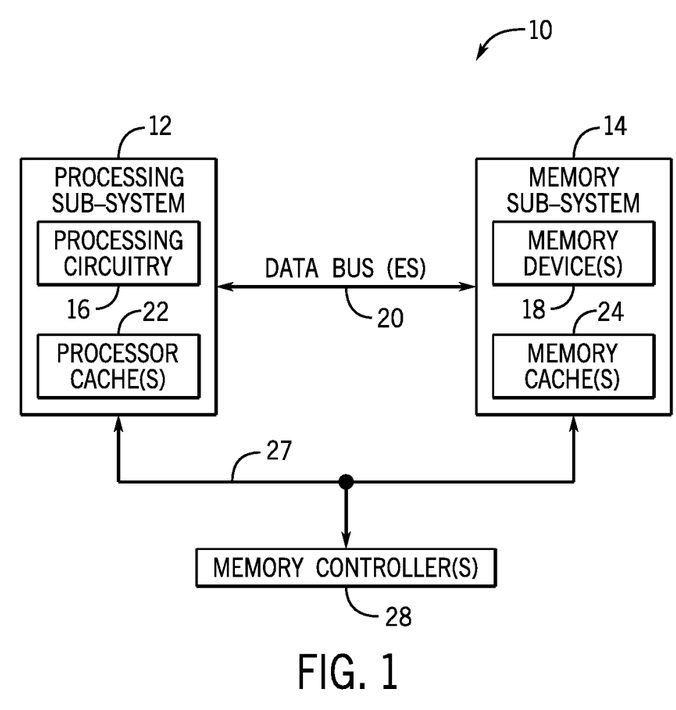
FIG. 1 is a simplified block diagram of an example of a computing system including a processing (e.g., host) sub-system and a memory sub-system, according to an embodiment of the present disclosure.

FIG. 1 is a simplified block diagram of an example of a computing system 10 (e.g., an apparatus), which includes a processing (e.g., host) sub-system 12 and a memory sub-system 14, according to an embodiment of the present disclosure. It should be understood that the computing system 10 may include computing sub-systems not shown in FIG. 1, such as a networking sub-system, a communication sub-system, a radio frequency sub-system, a user input sub-system, a display sub-system, or a combination thereof.

In some embodiments, the computing system 10 may be implemented in a single electronic device, such as a desktop computer, a workstation computer, a laptop computer, a server, a mobile phone, a virtual-reality headset, and/or the like. In other embodiments, the computing system 10 may be distributed between multiple electronic devices. For example, the processing sub-system 12 and the memory sub-system 14 may be implemented in a host device while other computing sub-systems, such as the user input and/or display sub-systems, may be implemented in a client (e.g., remote) device. In some embodiments, a computing sub-system may be distributed between multiple electronic devices. For example, a first portion of the processing sub-system 12 and/or a first portion of the memory sub-system 14 may be implemented in a host device while a second portion of the processing sub-system 12 and/or a second portion of the memory sub-system 14 may be implemented in a client device.

As shown, the processing sub-system 12 may include processing circuitry 16. The processing circuitry 16 may include one or more central processing units (CPUs), one or more graphics processing units (GPUs), one or more processor cores, or any combination thereof. During operation, the processing sub-system 12 may perform various operations such as determining output data by executing, via the processing circuitry 16, instructions to perform a data processing operations based on input data. The processing sub-system 12 may also include one or more caches 22 which may be integrated with the processing circuitry 16. The one or more caches 22 may provide storage locations directly accessible to the processing circuitry 16. The processing sub-system 12 may be coupled to one or more memory controllers 28 via one or more buses 27 to control storage of the one or more caches 22.

The memory sub-system 14 generally stores data accessible by the processing sub-system 12 via one or more memory devices 18. The memory devices 18 may include integrated circuits or chips with one or more memory cells (e.g., circuitry) organized into one or more memory arrays and thus, may include one or more tangible, non-transitory, computer-readable media. For example, the memory sub-system 14 may include one or more dynamic random-access memory (DRAM) devices, one or more static random-access memory (SRAM) devices, one or more flash (e.g., NAND) memory devices, one or more phase-change memory (e.g., 3D XPoint™) memory devices, one or more ferroelectric random access memory (FeRAM), or any combination thereof.

In some embodiments, multiple memory devices 18 may be implemented on a memory module, such as a dual in-line memory module (DIMM) or a single in-line memory module (SIMM). For example, a memory module may include a printed circuit board (PCB) and multiple memory devices 18 each disposed on a flat or planar (e.g., front or back) surface of the printed circuit board. Additionally, the memory devices 18 may be coupled to external pins formed along an (e.g., bottom) edge of the printed circuit board via conductive traces formed on the printed circuit board.

It should be understood that one or more of the memory devices 18 may be implemented using other packing techniques. For example, the memory devices 18 may be coupled to a (e.g., silicon) interposer to implement a 2.5D configuration. Additionally or alternatively, the memory devices 18 may be stacked to implement a 3D configuration. Furthermore, in some embodiments, the memory devices 18 may be implemented using organic packaging techniques. In other words, the techniques described in the present disclosure may be implemented as an on-package solution.

The memory sub-system 14 also includes one or more memory caches 24. Although implemented in the memory sub-system 14, the memory cache 24 may nevertheless provide faster data communication compared to a memory array implemented in the memory devices 18. For example, the memory cache 24 may be implemented with static random-access memory (SRAM) while the memory devices 18 may be implemented with dynamic random-access memory (DRAM). Additionally or alternatively, a memory cache 24 and a memory array implemented in the one or more memory devices 18 may utilize the same memory type (e.g., DRAM). In fact, in some embodiments, one or more of the memory caches 24 may be implemented in the memory devices 18. To control storage of the one or more memory caches 24, the memory sub-system 14 may be coupled to the one or more memory controllers 28 via the one or more buses 27.

As shown, the processing sub-system 12 is communicatively coupled to the memory sub-system 14 via one or more memory buses 20. The data buses 20 may include one or more cables, one or more wires, one or more conductive traces, one or more communication networks, or any combination thereof. Each of the one or more memory buses 20 may be dedicated to different communication types between the memory sub-system 14 and the processing sub-system 12. For example, the memory buses 20 may include a memory command bus and a memory data bus.

Figure 2:
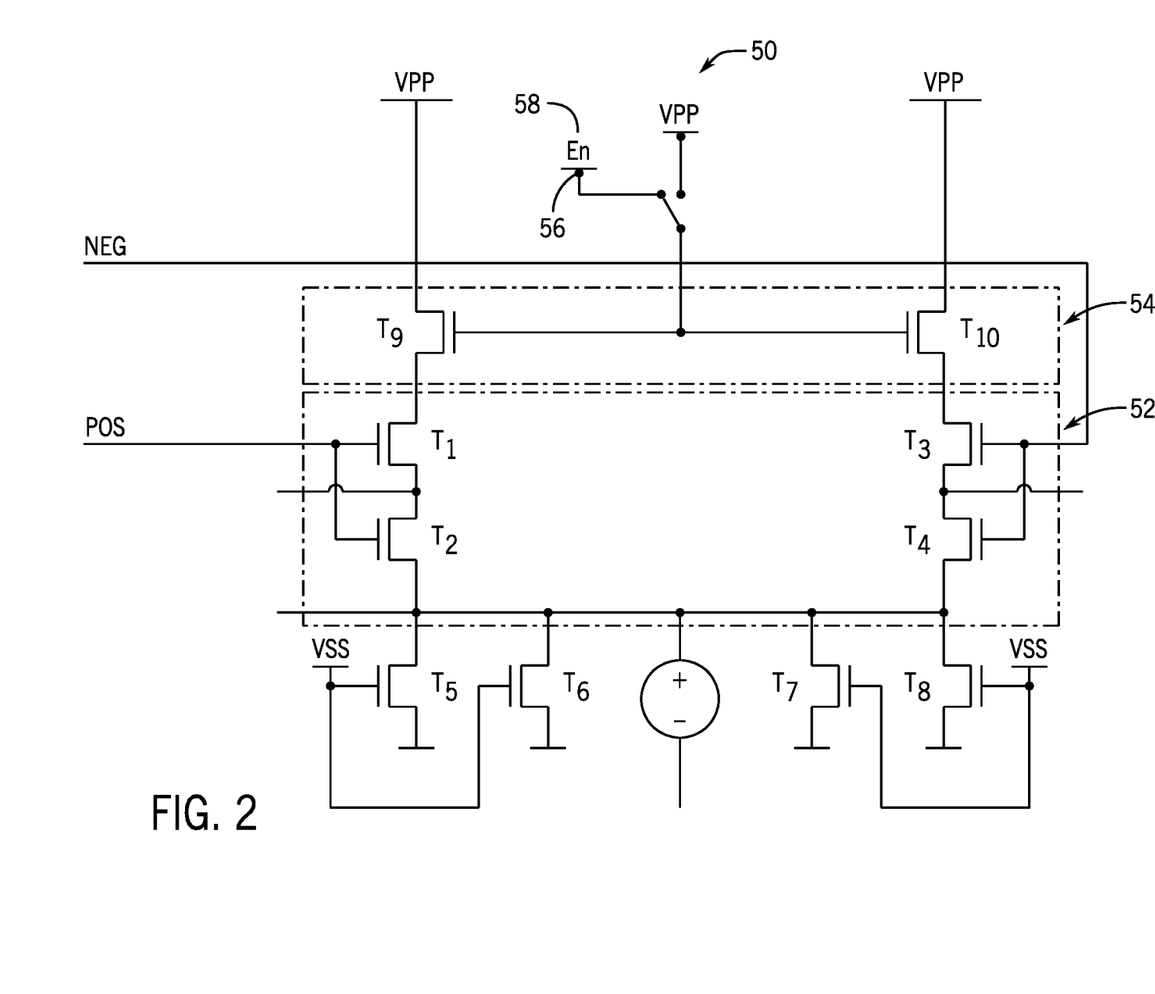
FIG. 2 is a schematic diagram of an example circuit of a standby amplifier of a memory device implemented in the memory sub-system of FIG. 1, according to an embodiment of the disclosure.

FIG. 2 is a schematic diagram of an example circuit 50 of a standby amplifier 52 of a memory device 18 implemented in the memory sub-system 14 of FIG. 1, according to an embodiment of the disclosure. The example circuit 50 includes a protection circuit 54 coupled to the standby amplifier 52. In some cases, the standby amplifier 52 may be referred to as a operational transconductance amplifier (OTA). In some cases, the standby amplifier may include the OTA 52 and the protection circuit 54. The standby amplifier 52 includes transistors T1, T2, T3, and T4. The transistors T1 and T2 may form a first input pair of the standby amplifier 52 and the transistors T3 and T4 may form a second input pair of the standby amplifier 52. The standby amplifier 52 may have a finite bandwidth and thus a gate voltage of the transistors T1 and T3 may increase slowly.

The protection circuit 54 includes transistors T9 and T10. The transistors T9 and T10 may be enabled (e.g., closed) when an enable voltage En 58 is applied to a gate thereof via a node 56. A larger enable voltage En 58 may close the transistors T9 and T10 more quickly and thus increase a voltage across the transistors T1 and T3 to a high voltage (e.g., VPP) more quickly.

The example circuit 50 also includes transistors T5, T6, T7, and T8 coupled to the amplifier 52. As shown, each of the transistors T1-T10 may be n-channel transistors. It should be understood that the transistors T1-T10 may be different types (n-channel or p-channel) and may be disposed in a different configuration than shown. In some cases, the standby amplifier 52 may provide up to about 500 microamps (μA).

In some embodiments, a maximum voltage of the transistor T1 may be, for example, about 1.4 volts from drain-to-source, gate-to-drain, or gate-to-source. If one of those voltage measurements exceeds about 1.4 volts, the transistor T1 may be damaged beyond repair and the standby amplifier 52 may no longer be operational. To prevent damage to the transistor T1 (and the transistor T3) and/or the standby amplifier 52, the protection circuit 54 may ensure that a drain voltage of the transistor T1 does not exceed a gate voltage of the transistor T9 minus a threshold voltage $V_T$ of the transistor T9. That is, a drain voltage of the transistor T1 may be less than the enable voltage En 58 at a gate of the transistor T9 minus the threshold voltage $V_T$ of the transistor T9. The transistor T10 may have a threshold voltage similar to that of the transistor T9. A drain voltage of the transistor T3 may be the same or substantially similar to the drain voltage of the transistor T9. In this way, the transistors T9 and T10 of the protection circuit 54 may limit a voltage of the transistors T1 and T3 of the standby amplifier 52.

At startup of the standby amplifier 52, a gate voltage of the transistors T1 and T2 may be about 1 volt and a gate voltage of the transistors T3 and T4 may be zero volts. However, a drain of the transistors T1 and T3 may be a high voltage (e.g., about 2.2 volts). In that case, a voltage across the transistors T1 and T3 may be larger than the maximum voltage of about 1.4 volts. Thus, the transistors T1 and/or T3 may be damaged.

Embodiments disclosed herein present apparatus and techniques to reduce and/or limit the enable voltage En 58 supplied to the transistors T1 and T3 via the protection circuit 54 during a startup operation. Once the startup operation is complete, the enable voltage En 58 may return to a previous voltage level. Advantageously, the reduced enable voltage En 58 may reduce an occurrence of damage to components (e.g., transistors T1-T4) of the standby amplifier 52 during the startup operation without impacting performance or operation thereafter.

Figure 3:
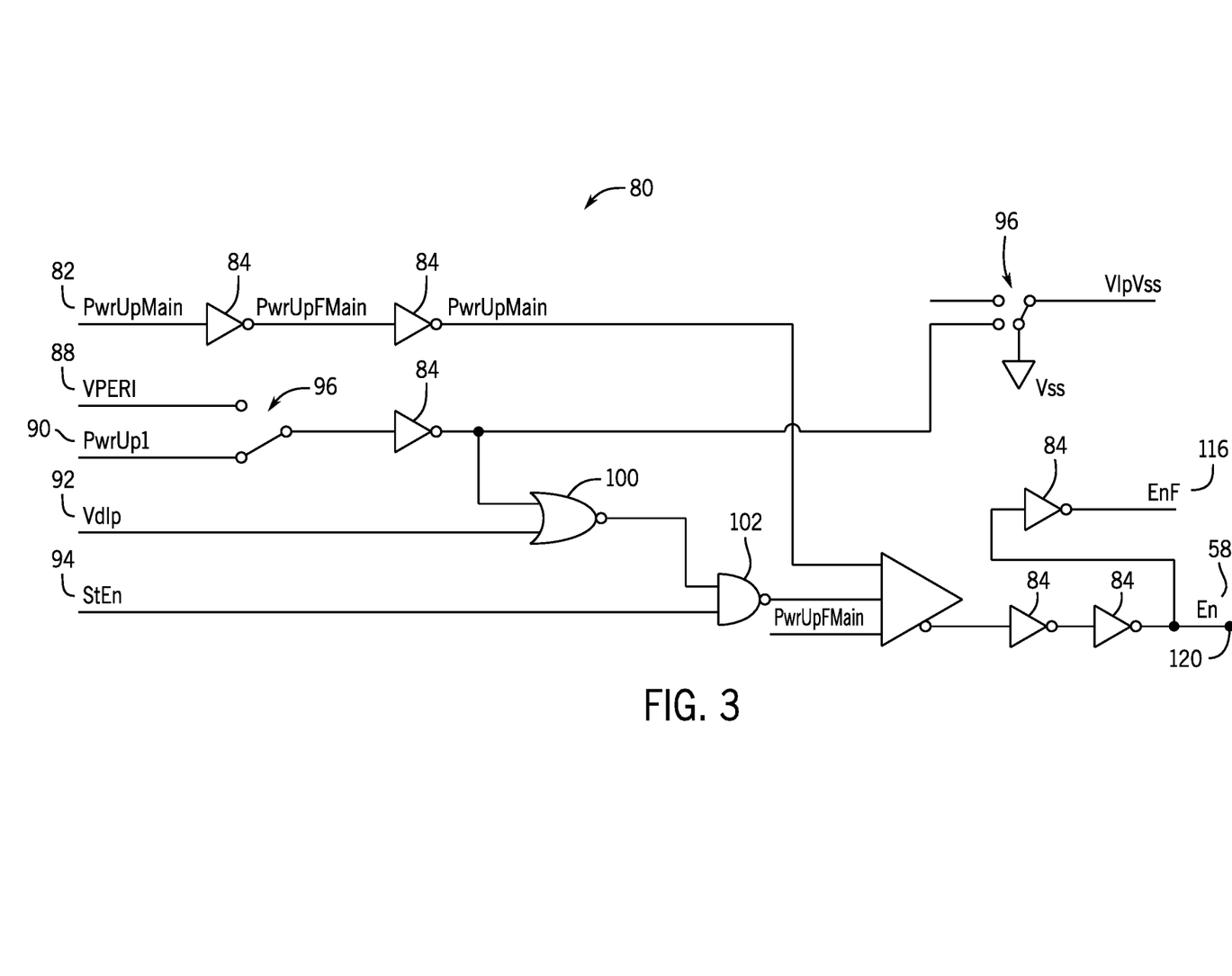
FIG. 3 is a schematic diagram of an example circuit for generating an enable signal for the standby amplifier of FIG. 2, according to an embodiment of the disclosure.

FIG. 3 is a schematic diagram of an example circuit 80 for generating the enable signal for the standby amplifier 52 of FIG. 2, according to an embodiment of the disclosure. As shown, the circuit 80 may receive various inputs 82 and 88-94. Specifically, an input of the circuit 80 may include a power up signal 90. When the power up signal 90 is high (e.g., between about 1 volt and about 1.5 volts, such as about 1.2 volts), the enable voltage En 58 may be high (e.g., about 2 volts). The circuit 80 includes a number of components including a number of inverters 84, switches 96, a logical NOR gate 100, and a logical NAND gate 102.

The enable voltage En 58 is output from the example circuit 80 via an output node 120. The enable voltage En 58 may be supplied to the protection circuit 54 via the node 56 as discussed with respect to FIG. 2. That is, the node 56 of the standby amplifier 52 may be coupled to the output node 120 of the circuit 80.

Figure 4:
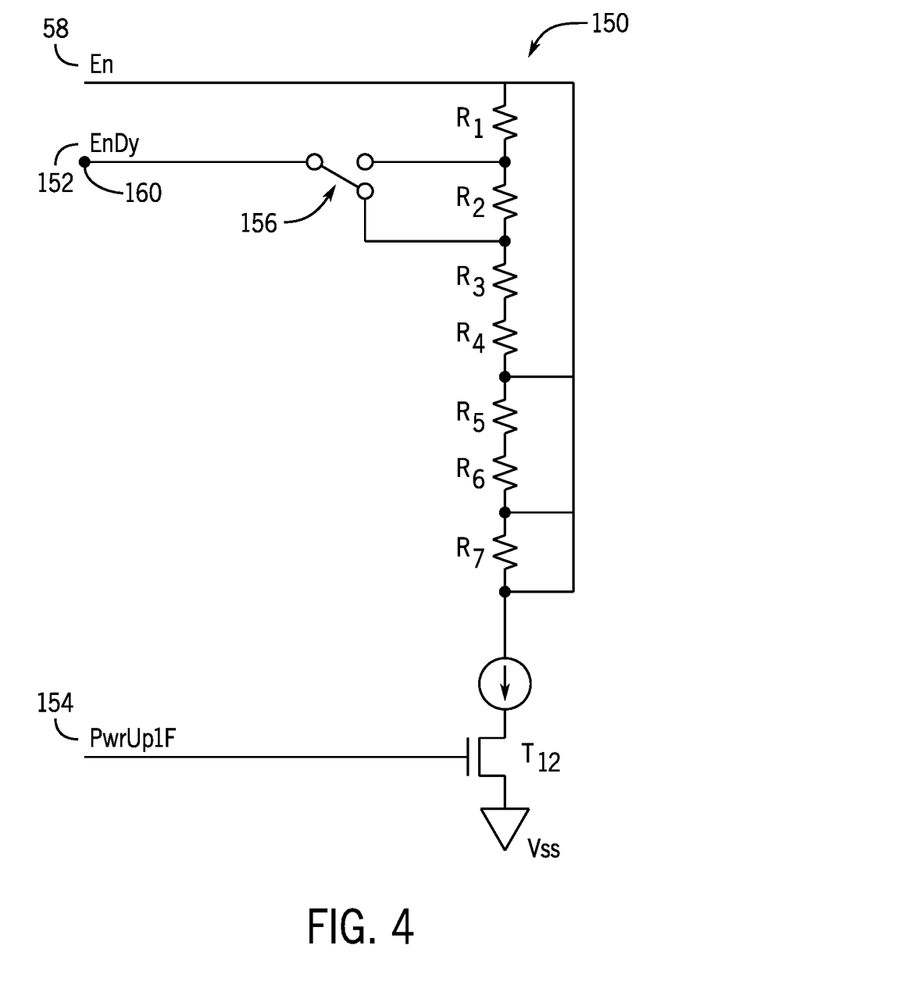
FIG. 4 is a schematic diagram of an example circuit for generating a reduced enable signal for the standby amplifier of FIG. 2, according to an embodiment of the disclosure.

FIG. 4 is a schematic diagram of an example circuit 150 for generating a reduced enable voltage EnDy 152 for the standby amplifier 52 of FIG. 2, according to an embodiment of the disclosure. The example circuit 150 is a voltage divider that generates a reduced enable voltage EnDy 152 from the enable voltage En 58. That is, the voltage divider 150 receives the enable voltage En 58 via the node output 120 of the circuit 80 of FIG. 3.

In some embodiments, the voltage divider 150 may be a resistive divider. As shown, the voltage divider 150 includes a number of resistors R1-R7. In some embodiments, a resistance of each of the resistors R1-R7 may be the same. For example, a resistance of each of the resistors may be about 30 kilo-ohms (kΩ). In other embodiments, the resistance of each resistor R1-R7 may be different. In some cases, an area of each resistor R1-R7 may be about 1 micrometer.

The reduced enable voltage EnDy 152 may be generated by tapping the voltage divider 150 between the resistors R2 and R3 via a switch 156. Thus, the reduced enable voltage EnDy 152 may be about 30% less than the enable voltage En 58. In some embodiments, the reduced enable voltage EnDy 152 may be about 15% less than the enable voltage En 58 by closing (or opening) the switch 156 such that the switch 156 taps the voltage divider 150 between the resistors R1 and R2.

The reduced enable voltage EnDy 152 may be provided to the standby amplifier 52 until an inverse power up signal 154 transitions from a logic high voltage (e.g., 1) to a logic low voltage (e.g., 0). That is, the inverse power up signal 154 may be a logic high before the power up operation and until the power up operation is complete. When the power up operation is complete, the power up signal 90 may transition from a logic low to a logic high. That is, the logic high of the inverse power up signal 154 may close the transistor T12 such that a current flows through the voltage divider 150 and the reduced enable voltage EnDy 152 is provided to the standby amplifier 52. Once the power up operation is complete, the inverse power up signal 154 may transition from the logic high to the logic low, causing the transistor T12 to open and stop current flowing through the resistors R1-R7. In that case, the enable voltage En 58 may be coupled to the protection circuit 54 after the power up operation is complete. In this way, the transistor T12 may control a voltage level provided to the protection circuit 54 such that a reduced enable voltage (e.g., EnDy 152) may be provided to the protection circuit during the power up operation.

In this way, the voltage divider 150 may provide the reduced enable voltage EnDy 152 to the standby amplifier 52 to reduce an occurrence of damage to the standby amplifier 52 and/or components thereof during the startup operation. Upon completion of the startup operation, the voltage divider 150 may provide the enable voltage En 58 (e.g., not reduced) to the standby amplifier 52 to ensure normal operation. It should be understood that the voltage divider 150 is merely an example and that many other configurations including different layouts and/or more or fewer resistors are possible to obtain different values of the reduced enable voltage EnDy 152. For example, the reduced enable voltage EnDy 152 may be generated by tapping the voltage divider 150 between different resistors than discussed above, such as between the resistors R3 and R4. Advantageously, the reduced enable voltage EnDy 152 may reduce an occurrence of damage to one or more components of the standby amplifier 52 and thus, may prolong a lifespan of the components and/or the standby amplifier.

Figure 5:
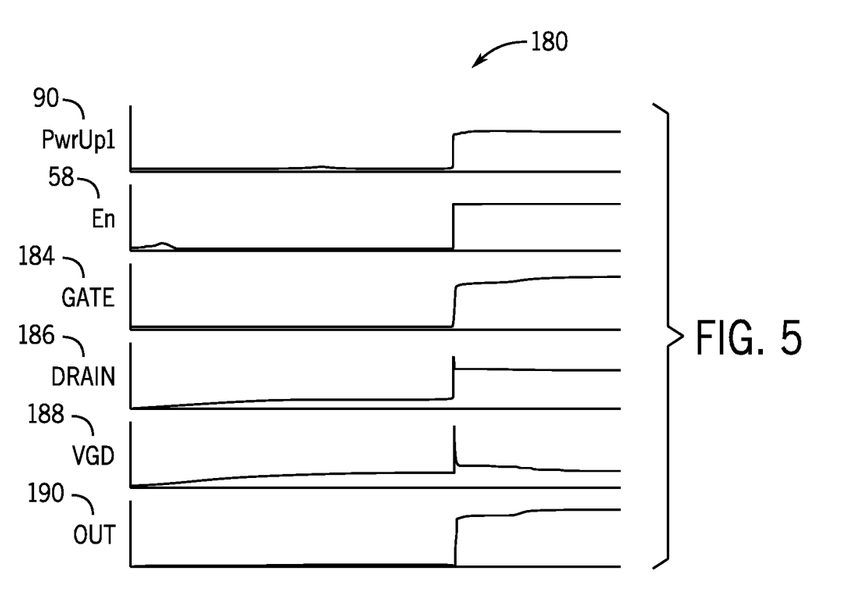
FIG. 5 is a graph illustrating signal waveforms of the standby amplifier of FIG. 2 using the example circuit of FIG. 3, according to an embodiment of the disclosure.

FIG. 5 is a graph 180 illustrating signal waveforms of the standby amplifier 52 of FIG. 2 using the example circuit 80 of FIG. 3, according to an embodiment of the disclosure. As shown, the graph 180 includes the power up signal 90, the enable voltage En 58, a gate voltage 184 of the transistor T1 or the transistor T3 of FIG. 2, a drain voltage 186 of the transistor T1 or the transistor T3, a gate to drain voltage (VGD) 188 across the transistor T1 or the transistor T3, and an output voltage 190 of the standby amplifier 52.

In operation, when the power up signal 90 transitions from low to high (e.g., from about 0 volts to about 1 volt), the gate to drain voltage (VGD) 188 across the transistor T1 or the transistor T3 increases to over 1.4 volts. That is, the gate to drain voltage (VGD) 188 across the transistor T1 or the transistor T3 exceeds the maximum voltage of the transistor T1 or the transistor T3. Thus, during the power up operation, the transistor T1 or the transistor T3 may be damaged by the relatively high voltage. In some cases, the high voltage (e.g., greater than 1.4 volts) may be applied across the transistor T1 or the transistor T3 for a relatively long time period (e.g., between about 1 microsecond (μs) and about 4 μs), increasing the damage to the transistor T1 or the transistor T3.

If the transistor T1 or the transistor T3 is not catastrophically damaged during a particular power up operation, the damage may be cumulative and thus the transistor T1 or the transistor T3 may be catastrophically damaged during a subsequent power up operation. As discussed above, embodiments herein present techniques to reduce the voltage supplied to the transistor T1 or the transistor T3 (and thus across the transistor T1 or the transistor T3) to substantially reduce an occurrence of damage caused thereby.

Figure 6:
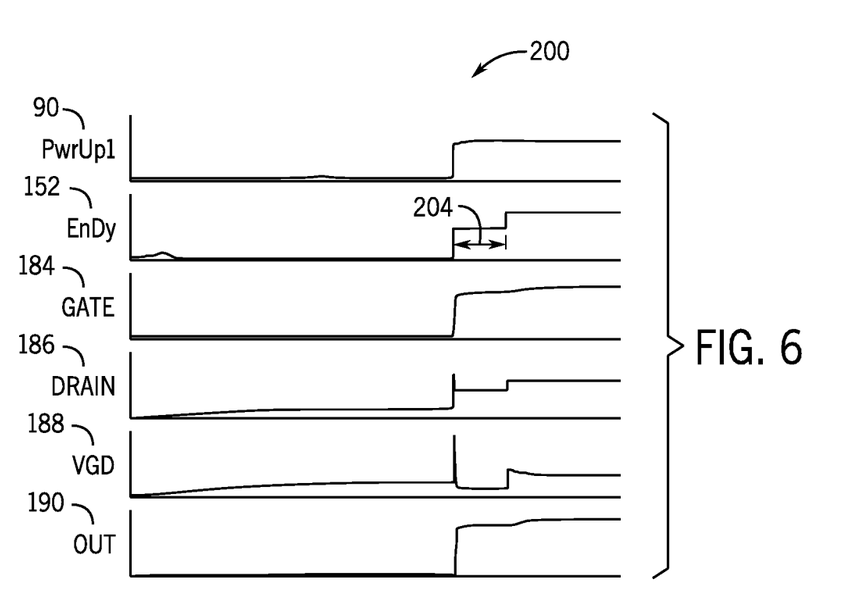
FIG. 6 is a graph illustrating signal waveforms of the standby amplifier of FIG. 2 using the example circuits of FIGS. 3 and 4, according to an embodiment of the disclosure.

FIG. 6 is a graph 200 illustrating signal waveforms of the standby amplifier 52 of FIG. 2 using the example circuits 80 and 150 of FIGS. 3 and 4, according to an embodiment of the disclosure. That is, the graph 200 illustrates signal waveforms using the voltage divider 150 to provide the reduced enable voltage EnDy 152 to the standby amplifier 52. As shown, the enable voltage En of the standby amplifier 52 of FIG. 2 is clamped to the reduced enable voltage EnDy 152 for a time period 204 during the power up operation of the standby amplifier 52. As a result of the reduced enable voltage EnDy 152, the gate to drain voltage (VGD) 188 across the transistor T1 or the transistor T3 may be reduced to about 1 volt. Once the power up operation is complete, the input voltage of the standby amplifier 52 may return to the enable voltage En 58 voltage level (e.g., when the power up signal 90 transitions from low to high and the inverse power up signal 154 transitions from high to low).

That is, the reduced enable voltage EnDy 152 maintains the gate to drain voltage (VGD) 188 below the maximum voltage (e.g., 1.4 volts) of the transistor T1 or the transistor T3. In this way, the reduced enable voltage EnDy 152 may reduce an occurrence of damage to one or more components of the standby amplifier 52 and thus, may prolong a lifespan of the components and/or the standby amplifier.

One or more specific embodiments of the present disclosure are described herein and depicted in the corresponding figures. The described embodiments are merely examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A standby amplifier comprising:
   an operational transconductance amplifier comprising a first input pair of transistors and a second input pair of transistors;
   a protection circuit comprising a first protection transistor coupled to the first input pair of transistors and a second protection transistor coupled to second input pair of transistors, the first protection transistor configured to selectively couple the first input pair of transistors to a voltage level based on an enable voltage, the second protection transistor configured to selectively couple the second input pair of transistors to a voltage level based on a reduced enable voltage; and
   an enable circuit for generating the reduced enable voltage comprising a voltage divider to reduce an enable voltage to be less than a maximum drain voltage of a first transistor of the first input pair of transistors.

2. The standby amplifier of claim 1, wherein the voltage divider comprises a resistive divider to generate the reduced enable voltage and wherein the reduced enable voltage is about thirty percent less than the enable voltage.

3. The standby amplifier of claim 2, wherein the enable circuit provides the reduced enable voltage to the protection circuit during a power up operation of the standby amplifier.

4. The standby amplifier of claim 2, wherein the voltage divider comprises a transistor to selectively couple the protection circuit to the reduced enable voltage.

5. The standby amplifier of claim 2, wherein the resistive divider comprises a number of resistors having a resistance of about 30 kilo-ohms.

6. The standby amplifier of claim 1, wherein a maximum drain-to-gate voltage of the first transistor of the first input pair of transistors is about 1.4 volts.

7. The standby amplifier of claim 6, wherein the protection circuit maintains a drain voltage of the first transistor of the first input pair of transistors below a gate voltage of the first protection transistor minus a threshold voltage of the first protection transistor.

8. The standby amplifier of claim 1, wherein a maximum voltage of a first transistor of the second input pair of transistors is about 1.4 volts.

9. A memory device comprising:
   a memory array comprising a plurality of memory cells arranged in a plurality of memory cell rows and a plurality of memory cell columns, wherein each memory cell of the plurality of memory cells is configured to store a data bit;
   a standby amplifier coupled to the memory array comprising a first input pair of transistors and a second input pair of transistors;

a protection circuit comprising a first protection transistor coupled to the first input pair of transistors and a second protection transistor coupled to second input pair of transistors, the first protection transistor configured to selectively couple the first input pair of transistors to a voltage level based on an enable voltage, the second protection transistor configured to selectively couple the second input pair of transistors to a voltage level based on a reduced enable voltage; and an enable circuit for generating the reduced enable voltage comprising a voltage divider to reduce an enable voltage to be less than a maximum drain voltage of a first transistor of the first input pair of transistors.

10. The memory device of claim 9, wherein a maximum drain-to-gate voltage of the first transistor of the first input pair of transistors is about 1.4 volts and wherein the reduced enable voltage is about thirty percent less than the enable voltage.

11. The memory device of claim 10, wherein the protection circuit maintains a drain voltage of the first transistor of the first input pair of transistors below a gate voltage of the first protection transistor minus a threshold voltage of the first protection transistor.

12. The memory device of claim 9, wherein the voltage divider comprises a resistive divider to generate the reduced enable voltage.

13. The memory device of claim 12, wherein the enable circuit provides the reduced enable voltage to the protection circuit during a power up operation of the standby amplifier.

14. The memory device of claim 12, wherein the voltage divider comprises a transistor to selectively couple the protection circuit to the reduced enable voltage.

15. The memory device of claim 12, wherein the resistive divider comprises a number of resistors having a resistance of about 30 kilo-ohms.

16. A memory system comprising:
a memory array comprising a plurality of memory cells arranged in a plurality of memory cell rows and a plurality of memory cell columns, wherein each memory cell of the plurality of memory cells is configured to store a data bit;
a standby amplifier coupled to the memory array comprising a first input pair of transistors and a second input pair of transistors;
an enable circuit for generating an enable voltage for the standby amplifier;
a protection circuit comprising a first protection transistor coupled to the first input pair of transistors and a second protection transistor coupled to second input pair of transistors, the first protection transistor configured to selectively couple the first input pair of transistors to a voltage level based on the enable voltage, the second protection transistor configured to selectively couple the second input pair of transistors to a voltage level based on the enable voltage; and
a reduced enable circuit to generate a reduced enable voltage based on the enable voltage, wherein the reduced enable voltage is less than the enable voltage.

17. The memory system of claim 16, wherein the reduced enable circuit comprises a voltage divider and wherein the reduced enable voltage is about thirty percent less than the enable voltage.

18. The memory system of claim 17, wherein the voltage divider comprises a resistive voltage divider circuit.

19. The memory system of claim 18, wherein the reduced enable circuit provides the reduced enable voltage to the protection circuit during a power up operation.

20. The memory system of claim 19, wherein the enable circuit provides the enable voltage to the protection circuit after the power up operation.

* * * * *